(12) United States Patent
Wang

(10) Patent No.: US 7,057,533 B2
(45) Date of Patent: Jun. 6, 2006

(54) APPARATUS FOR PROGRAMMING EXTENDED CODE OF KEYBOARD AND METHOD FOR THE SAME

(75) Inventor: Chin Ping Wang, Hsintien (TW)

(73) Assignee: Lite-On Technology Corporation, Taipei (TW)

( * ) Notice: Subject to any disclaimer, the term of this patent is extended or adjusted under 35 U.S.C. 154(b) by 682 days.

(21) Appl. No.: 10/232,449

(22) Filed: Sep. 3, 2002

(65) Prior Publication Data

US 2003/0169187 A1 Sep. 11, 2003

(30) Foreign Application Priority Data

Mar. 5, 2002 (TW) .............................. 91104078 A

(51) Int. Cl.
*H03K 17/94* (2006.01)
*G09G 5/00* (2006.01)

(52) U.S. Cl. ......................................... 341/22; 345/173
(58) Field of Classification Search ............ 341/21–22, 341/26; 345/140, 173
See application file for complete search history.

(56) References Cited

U.S. PATENT DOCUMENTS

| 4,484,305 | A  | * | 11/1984 | Ho ............................. 715/535 |
| 5,818,361 | A  | * | 10/1998 | Acevedo ....................... 341/23 |
| 5,847,697 | A  | * | 12/1998 | Sugimoto ................... 345/168 |
| 6,198,474 | B1 | * | 3/2001  | Roylance .................... 345/168 |

* cited by examiner

*Primary Examiner*—Michael Horabik
*Assistant Examiner*—Kimberly Jenkins
(74) *Attorney, Agent, or Firm*—Rosenberg, Klein & Lee

(57) ABSTRACT

A controlling apparatus for programming extended code of keyboard and a method for the same. The keyboard receives an extended code processing command and judges the extended code processing command to be used for enabling a second key code or disabling a second key code of the key. The keyboard also receives key code setting parameters. The keyboard has a mode selection key to toggle the keyboard between a standard key code mode and an extended key code mode. Therefore, all keys on the keyboard can be assigned with new extended code or disabled for the new extended code to broaden the function thereof.

12 Claims, 4 Drawing Sheets

APPARATUS FOR PROGRAMMING EXTENDED CODE OF KEYBOARD AND METHOD FOR THE SAME

FIELD OF THE INVENTION

The present invention relates to a apparatus for programming extended code of keyboard and a method for the same, especially to a apparatus for setting or disabling augmented extended code for all keys on a keyboard and a method for the same.

BACKGROUND OF THE INVENTION

The standard keyboard generally uses standard key codes defined with reference to ASCII and ISO646, wherein 128 symbols are expressed by 7 bits. The 128 symbols comprise 94 graphic symbols and 34 control characters. Therefore, the number of available key codes is limited and the expansion ability of hot key is influenced.

To overcome above problem, IBM had defined extended codes for special keys (such as Insert, Home, Page up, Page down) on keyboard wherein E0 code is prefixed to the standard key codes to broaden the function of keyboard.

However, the extended code proposed by IBM is applicable only to partial hot keys and partial standard keys and cannot be applicable to all keys on the keyboard. Moreover, the extended codes are permanently set and cannot be arbitrarily set or changed for temporary usage.

SUMMARY OF THE INVENTION

It is an object of the present invention to provide an apparatus for programming extended code of keyboard and a method for the same, wherein all keys on the keyboard can be assigned with augmented extended codes and enabled or disabled for the augmented extended codes to broaden the function of the keyboard.

It is another object of the present invention to provide an apparatus for programming extended code of keyboard and a method for the same, wherein all keys have permanent or temporary key code set by enabling or disabling augmented extended code thereto and switched by a mode selection key. To achieve above object, the present invention provides a method for programming extended code of a keyboard, wherein each key on the keyboard has at least two key codes (for example, hereinafter they define as a first key code and a second key code), the method converting a first key code of a key on the keyboard into a second key code, the method comprising following steps: (a) the keyboard receiving an extended code processing command and judging the extended code processing command to be used for enabling or disabling augmented extended code of the key, the keyboard further receiving a sequence of key code setting parameters after the extended code processing command, the key code setting parameter defines the augmented extended code of which key should be enabled or disabled; (b) a keyboard program detecting a keystroke of the key and discriminating an operation mode of the keyboard between a standard mode and an extended mode; if the key is operated at the standard mode, a first key code of the key is sent, else a next step (c) is executed; and (c) if the extended code of the key has been enabled, a second key code of the key is sent, else the first key code of the key is sent.

To achieve above object, the present invention provides an apparatus for programming extended code of a keyboard, comprising a mode selection key to toggle the keyboard between a standard mode and an extended mode.

The various objects and advantages of the present invention will be more readily understood from the following detailed description when read in conjunction with the appended drawing, in which:

DETAILED DESCRIPTION OF THE INVENTION

Figure 1:
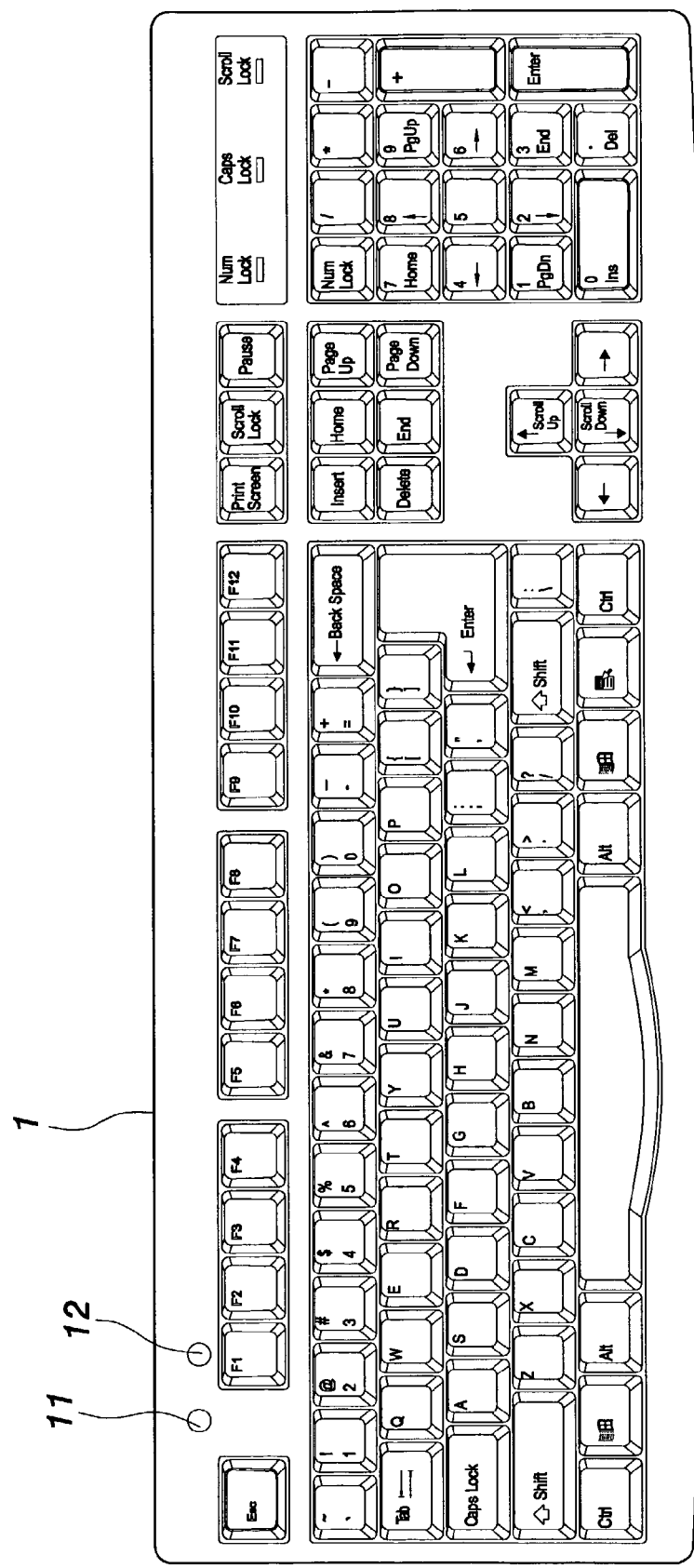
FIG. 1 shows a top view of a keyboard according to the present invention.

FIG. 1 shows a top view of a keyboard according to the present invention. For clarity, the original key codes of the keyboard 1 are referred to first key codes (before programming) and the key codes of the keyboard 1 programmed with augmented extended codes are referred to second key codes (after programming). The first key codes are corresponding to the standard codes for the typing region of the keyboard 1, or to extended codes of IBM special keys. The keyboard 1 is added with a mode selection key 11 and a preview key 12. The mode selection key 11 is used to toggle the keyboard 1 between a standard mode and an extended mode. In other words by using the mode selection key 11, the keyboard 1 will generate the first key codes in the standard mode, or generate the second key codes in the extended mode (if the augmented extended mode is enabled, which will be described below). The second key code could be constituted by adding a prefix code (such as E0h) before the standard key code when the first key code is standard key code; or defined as other extended code when the first key code is extended code.

The preview key 12 is used to check the setting status of all extended codes, which could be shown on a monitor when the preview key 12 is pressed.

Figure 2:
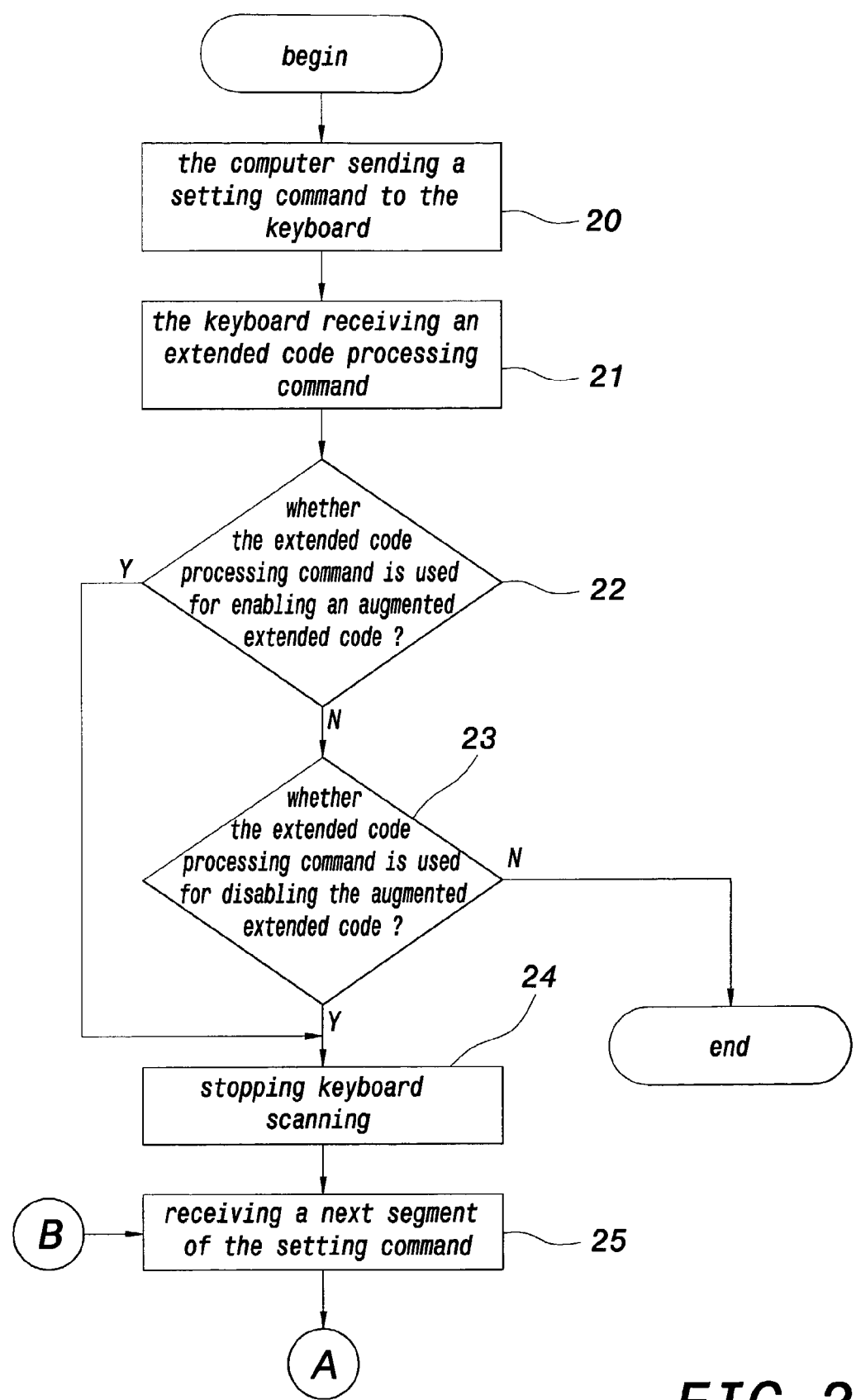
FIG. 2 is a part of flowchart of the inventive method for programmable extended code for keyboard.
Figure 3:
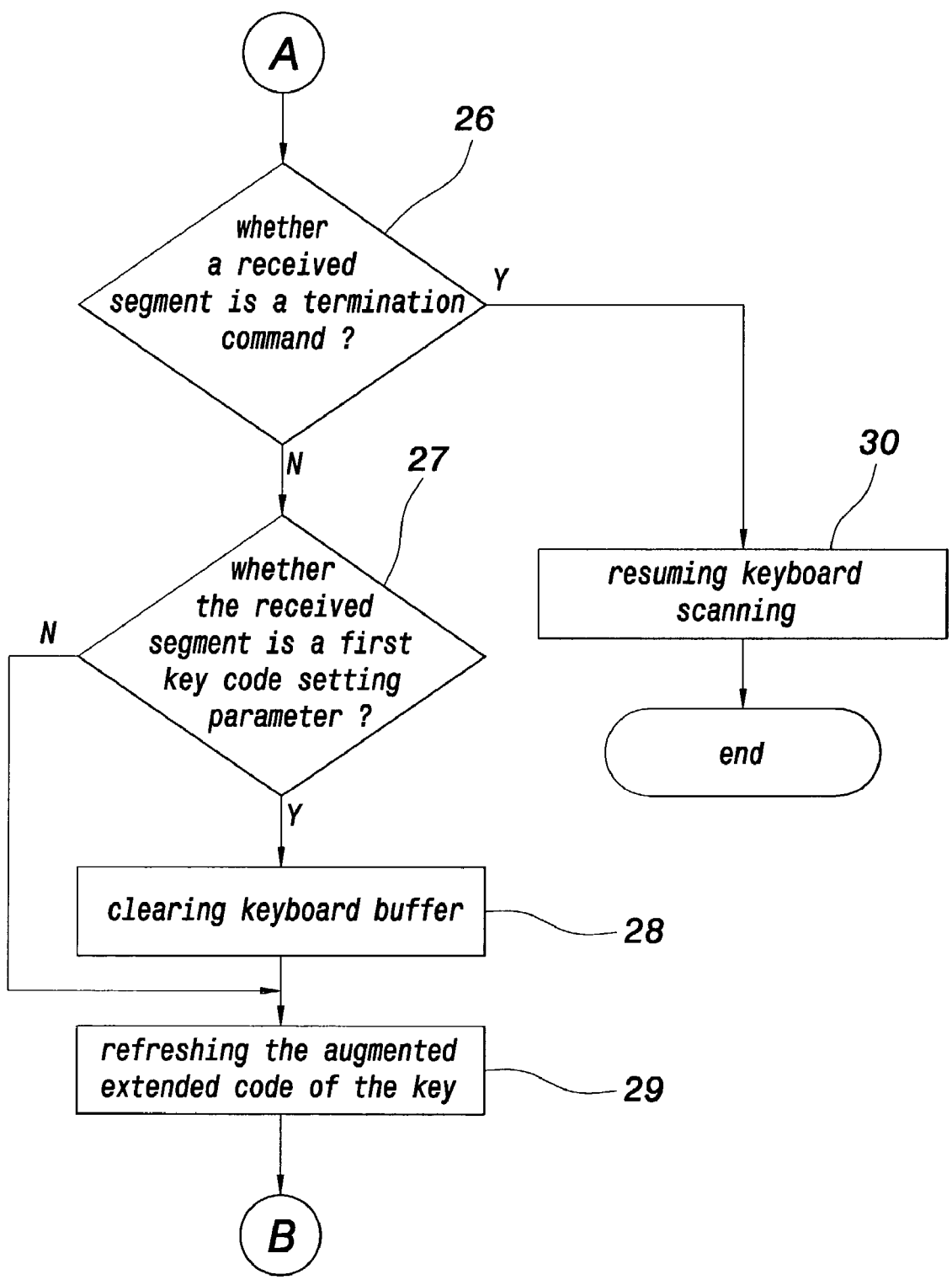
FIG. 3 is another part of flowchart of the inventive method for programmable extended code for keyboard.

FIGS. 2 and 3 show the flowcharts of the method for programmable extended code for keyboard, the method of the present invention comprising following steps:

step 20: the computer sending a setting command (including an extended code processing command, a sequence of key code setting parameters and a termination command) to the keyboard;

step 21: the keyboard receiving the extended code processing command;

step 22: judging whether the extended code processing command is used for enabling augmented extended code? if true, going to step 24, else going to step 23;

step 23: judging whether the extended code processing command is used for disabling augmented extended code? if true, going to step 24, else ending the process;

step 24: stopping keyboard scanning;

step 25: receiving a next segment of the setting command;

step 26: judging whether a received segment is a termination command? if true, going to step 30, else going to step 27;

step 27: judging whether the received segment is a first key code setting parameter ? if true, going to step 28, else going to step 29;

step 28: clearing keyboard buffer;

step 29: refreshing the augmented extended code of the key and going back to step 25;

step 30: resuming keyboard scanning and then ending the process.

In the step 20, the computer has a driver program or an application program with user interface to facilitate the enabling, disabling and checking operation of the augmented extended codes of keys for user. In other words, the user can use the user interface to enable and disable the augmented extended code of a selected key and sends a key code setting parameter corresponding to the selected key. The setting command comprises an extended code processing command, a sequence of key code setting parameters (in case of enabling or disabling of the augmented extended code of the selected keys) and ended by a termination command.

The step 27 judges whether a next segment of the setting command is a first key code setting parameter. If true, the keyboard buffer is cleared in step 28 to receive subsequent key code setting parameters. In step 29, the augmented extended code of the selected key is enabled or disabled with reference to the extended code processing command. The step is executed according to the judgment steps 22 and 23 for enabling or disabling the augmented extended code for the key. In the operation of enabling augmented extended code, the second key code is constituted by adding a prefix code (such as E0h) before the standard key code when the first key code is a standard key code; or defined as other extended code when the first key code is an extended code (for special keys on IBM keyboard or hot keys). In the operation of disabling augmented extended code, the selected key will only generate the first key code when being pressed.

Figure 4:
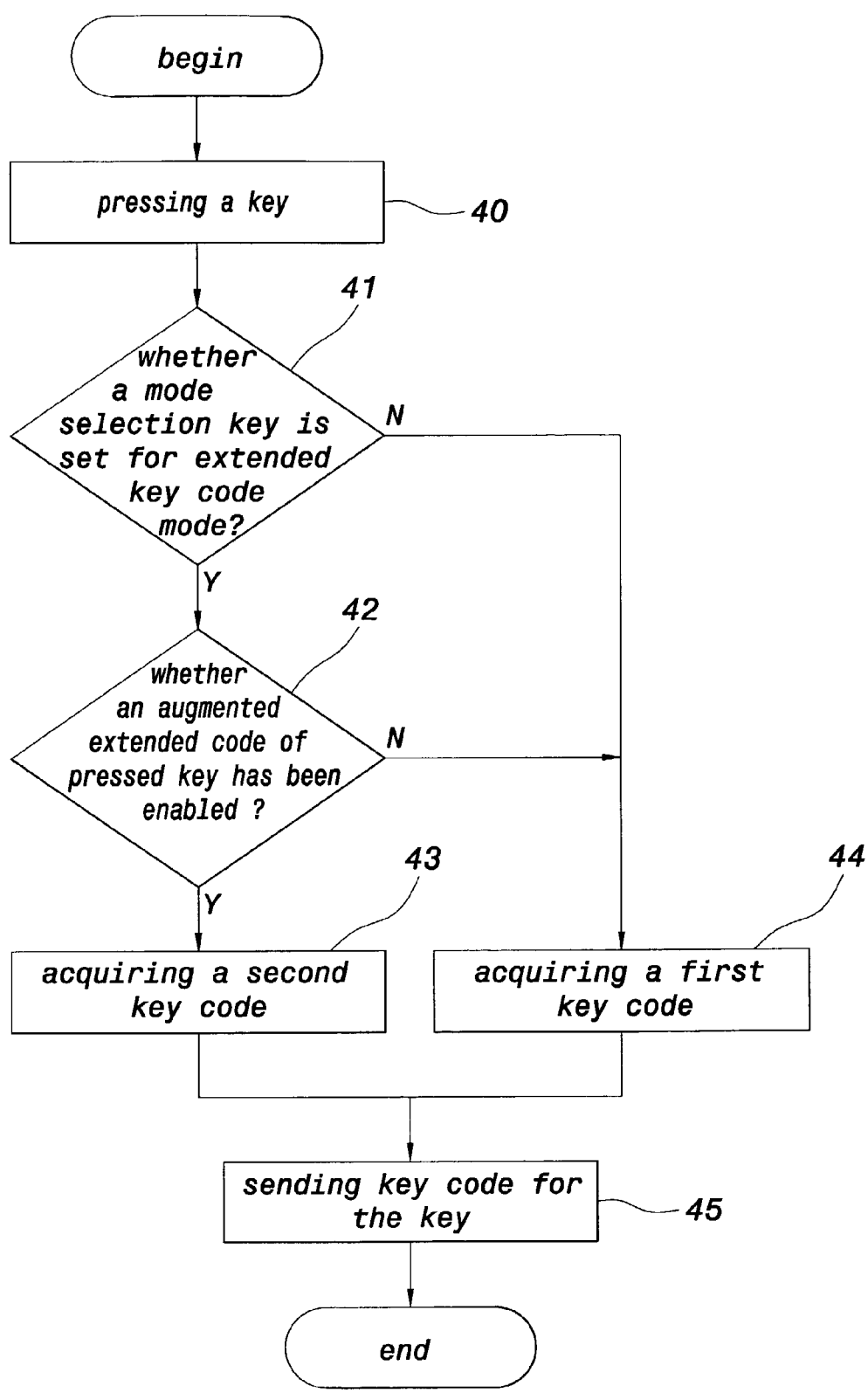
FIG. 4 shows the flowchart depicting an operational method of keyboard according to the present invention.

FIG. 4 shows the flowchart depicting an operational method of keyboard set by the process shown in FIGS. 2 and 3. The operational method uses a hook procedure to check the key code of the key being pressed. Afterward, the operational method sends the first key code or the second key code associated with the pressed key depending on whether the keyboard is in the standard mode or the extended mode. The operational method shown in FIG. 4 comprises following steps:

step 40: pressing a key;

step 41: judging whether a mode selection key is set for extended mode ? if true, going to step 42, else going to step 44;

step 42: judging whether the pressed key has been set with an augmented extended code ? if true, going to step 43, else going to step 44.

step 43: acquiring a second key code;

step 44: acquiring a first key code;

step 45: sending the key code for the key and ending the procedure.

As can be seen from above description, the augmented extended code of the key can be programably enabled and disabled to broaden the function of the key. Moreover, the function of the augmented extended code can be defined by the operation system, driver program or the application program of the computer.

The apparatus for programmable extended code of keyboard according to the present invention can be exemplified by following example.

A user utilizes a user interface of a computer to enable augmented extended codes for keys A, B and C. Afterward the computer sends an extended code processing command and following by a sequence of key code setting parameter to the keyboard for enabling the augmented extended codes of the keys A, B and C, wherein a prefix is added to each of the standard key codes of the keys A, B and C. Moreover, the mode selection key 11 is switched to the extended mode. When one of the keys A, B or C is pressed, the keyboard sends the second key code for the keys A, B or C (E0 1C, E0 32, E0 21) instead of the first key code (1C, 32, 21). Therefore, the keys A, B and C can be used to execute expanded function defined by the augmented extended code instead of inputting characters A, B and C. Moreover, the user can check the status of extended code setting of the keys A, B and C by pressing the preview key 12. The functions of the keys A, B and C can be switched by pressing the mode selection key 11 for original usage (inputting characters) in the standard mode or enabling pre-defined function (for example: drinking a heal potion when the user is playing a role-playing game) in the extended mode.

To sum up, the apparatus for programmable extended code of keyboard and a method for the same have following advantages:

1. All keys on the keyboard can be assigned with an augmented extended code and enabled or disabled for the augmented extended code, whereby the function of the keyboard is programmable and broadened.

2. All keys have permanent or temporary key code set by setting extended code thereto.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

I claim:

1. A controlling method for programming extended code of a keyboard, the controlling method providing a second key code for the keyboard, which already has a first key code, and controlling a selection between the first key code and the second key code, the method comprising the steps of:
   (a) the keyboard receiving an extended code processing command and judging the extended code processing command to be used for enabling the second key code or disabling the second key code; the keyboard further receiving a key code setting parameters after the extended code processing command, which defines an operating status of the second key code of the key;
   (b) updating the operating status of the key as either enabled with said second key code or disabled with said second key code in accordance with said extended code processing command;
   (c) a keyboard program of the keyboard detecting a keystroke of the key and discriminating an operation mode of the key between a standard key code mode and an extended key code mode; if the key is operated at the standard key code mode, a first key code of the key is sent, else a next step (d) is executed;
   (d) if the key has been set with extended key code, a second key code of the key is sent, else the first key code of the key is sent.

2. The controlling method for programming extended code as in claim 1, wherein the first key code is one of the standard key code of a key in a typing region and a standardized extended key code of a special key.

3. The controlling method for programming extended code as in claim 2, wherein the second key code is a standard key code with a prefix when the first key code is the standard key code of the key in the typing region.

4. The controlling method for programming extended code as in claim 2, wherein the second key code is another extended key code when the first key code is the extended key code of the special key.

5. The controlling method for programming extended code as in claim 1, wherein the keyboard further has a preview key to show an extended key code setting of the key.

6. The controlling method for programming extended code as in claim 1, wherein the extended code processing command in step (a) is sent by a computer.

7. The controlling method for programming extended code as in claim 1, wherein the key code setting parameters in step (a) are ended by a termination command.

8. The controlling method for programming extended code as in claim 1, wherein the keyboard further has a mode selection key to toggle the keyboard between the standard key code mode for sending the first key code and the extended key code mode for sending the second key code in step (c).

9. A controlling method for programming extended code of a keyboard, the controlling method providing a second key code for the keyboard, which already has a first key code, and controlling a selection between the first key code and the second key code, the method providing a mode selection key to toggle the keyboard between a standard key code mode and an extended key code mode, and the method comprising the steps of:

(a) the keyboard receiving an extended code processing command and key code setting parameters after the extended code processing command, which defines an operating status of the second key code of the key;

(b) updating the operating status of the second key code of the key corresponding to the key code setting parameters;

(c) a keyboard program of the keyboard detecting a keystroke of the key and discriminating an operation mode of the key between the standard key code mode and the extended key code mode; if the key is operated at the standard key code mode, a first key code of the key is sent, else a next step (d) is executed;

(d) if the key has been set with extended key code, a second key code of the key is sent, else the first key code of the key is sent; and (e) providing a preview key operable to show an extended key code setting of the keys on the keyboard.

10. The controlling method for programming extended code as in claim 9, wherein the key code setting parameters in step (a) are ended by a termination command.

11. The controlling method for programming extended code as in claim 9, wherein in the step (b), the operation of updating the setting of the second key code of the key is to enable the second key code.

12. The controlling method for programming extended code as in claim 9, wherein in the step (b), the operation of updating the setting of the second key code of the key is to disable the second key code.

\* \* \* \* \*